(12) United States Patent
Likhanskii et al.

(10) Patent No.: US 11,437,215 B2
(45) Date of Patent: Sep. 6, 2022

(54) ELECTROSTATIC FILTER PROVIDING REDUCED PARTICLE GENERATION

(71) Applicant: APPLIED Materials, Inc., Santa Clara, CA (US)

(72) Inventors: Alexandre Likhanskii, Malden, MA (US); Antonella Cucchetti, Gloucester, MA (US); Eric D. Hermanson, Georgetown, MA (US); Frank Sinclair, Boston, MA (US); Jay T. Scheuer, Rowley, MA (US); Robert C. Lindberg, Rockport, MA (US)

(73) Assignee: APPLIED Materials, Inc., Santa Clara, CA (US)

( * ) Notice: Subject to any disclaimer, the term of this patent is extended or adjusted under 35 U.S.C. 154(b) by 424 days.

(21) Appl. No.: 16/714,097

(22) Filed: Dec. 13, 2019

(65) Prior Publication Data

US 2021/0183609 A1 Jun. 17, 2021

(51) Int. Cl.
*H01J 37/12* (2006.01)
*H01J 37/24* (2006.01)
(Continued)

(52) U.S. Cl.
CPC ............ *H01J 37/12* (2013.01); *H01J 37/243* (2013.01); *H01J 37/3007* (2013.01);
(Continued)

(58) Field of Classification Search
CPC .. H01J 37/04; H01J 37/05; H01J 37/12; H01J 37/15; H01J 37/3171; H01J 2237/12;
(Continued)

(56) References Cited

U.S. PATENT DOCUMENTS 6,326,631 B1 12/2001 Politiek et al.
6,573,517 B1 6/2003 Sugitani et al.
(Continued)

FOREIGN PATENT DOCUMENTS

JP 2015-191740 A 11/2015
WO 2017-019335 A1 2/2017

OTHER PUBLICATIONS

International Search Report dated Feb. 17, 2021, for the International Patent Application No. PCT/US2020/057252, filed on Oct. 25, 2020, 4 pages.
(Continued)

*Primary Examiner* — Robert H Kim
*Assistant Examiner* — Hsien C Tsai
(74) *Attorney, Agent, or Firm* — KDB Firm PLLC

(57) ABSTRACT

Provided herein are approaches for decreasing particle generation in an electrostatic lens. In some embodiments, an ion implantation system may include an electrostatic lens including an entrance for receiving an ion beam and an exit for delivering the ion beam towards a target, the electrostatic lens including a first terminal electrode, a first suppression electrode, and a first ground electrode disposed along a first side of an ion beamline, wherein the first ground electrode is grounded and positioned adjacent the exit. The electrostatic lens may further include a second terminal electrode, a second suppression electrode, and a second ground electrode disposed along a second side of the ion beamline, wherein the second ground electrode is grounded and positioned adjacent the exit. The implantation system may further include a power supply operable to supply a voltage and a current to the electrostatic lens for controlling the ion beam.

19 Claims, 3 Drawing Sheets

(51) Int. Cl.
*H01J 37/30* (2006.01)
*H01L 21/425* (2006.01)
*H01J 37/32* (2006.01)
*H01J 37/08* (2006.01)

(52) U.S. Cl.
CPC ...... *H01J 37/32568* (2013.01); *H01L 21/425* (2013.01); *H01J 37/08* (2013.01)

(58) Field of Classification Search
CPC .......... H01J 2237/024; H01J 2237/053; H01J 2237/057; H01J 2237/121; H01J 2237/151; H01J 2237/1502; H01J 2237/04756

See application file for complete search history.

(56) References Cited

U.S. PATENT DOCUMENTS

| | | | |
|---|---|---|---|
| 7,326,941 | B2 | 2/2008 | Chen et al. |
| 7,888,653 | B2 | 2/2011 | Kellerman et al. |
| 9,293,295 | B2 | 3/2016 | Yagita et al. |
| 10,504,682 | B2 | 12/2019 | Chang et al. |
| 10,714,301 | B1 | 7/2020 | Chang et al. |
| 2012/0168637 | A1 | 7/2012 | Radovanov et al. |
| 2016/0189912 | A1* | 6/2016 | Eisner ............... H01J 37/30 250/282 |
| 2019/0198283 | A1* | 6/2019 | Radovanov ............ H01J 37/05 |
| 2020/0161076 | A1 | 5/2020 | Likhanskii et al. |
| 2020/0161077 | A1 | 5/2020 | Likhanskii et al. |
| 2020/0161078 | A1 | 5/2020 | Likhanskii et al. |
| 2020/0161089 | A1 | 5/2020 | Likhanskii et al. |
| 2021/0020399 | A1 | 1/2021 | Likhanskii et al. |
| 2021/0090845 | A1 | 3/2021 | Lindberg et al. |

OTHER PUBLICATIONS

Written Opinion dated Feb. 17, 2021, for the International Patent Application No. PCT/US2020/057252, filed on Oct. 25, 2020, 4 pages.

* cited by examiner

100 ↘

PROVIDING AN ELECTROSTATIC LENS INCLUDING AN ENTRANCE FOR RECEIVING AN ION BEAM AND AN EXIT FOR DELIVERING THE ION BEAM TOWARDS A TARGET, THE ELECTROSTATIC LENS INCLUDING FIRST AND SECOND TERMINAL ELECTRODES, FIRST AND SECOND SUPPRESSION ELECTRODES, AND FIRST AND SECOND GROUND ELECTRODES, WHEREIN THE FIRST AND SECOND GROUND ELECTRODES ARE GROUNDED AND POSITIONED ADJACENT THE EXIT
101

↓

SUPPLYING A VOLTAGE AND A CURRENT TO THE ELECTROSTATIC LENS FOR CONTROLLING THE ION BEAM
103

FIG. 3

ELECTROSTATIC FILTER PROVIDING REDUCED PARTICLE GENERATION

FIELD OF THE DISCLOSURE

The disclosure relates generally to semiconductor processing and, more particularly, to electrostatic filters providing reduced particle generation.

BACKGROUND OF THE DISCLOSURE

Ion implantation is a process of introducing dopants or impurities into a substrate via bombardment. In semiconductor manufacturing, the dopants are introduced to alter electrical, optical, or mechanical properties. For example, dopants may be introduced into an intrinsic semiconductor substrate to alter the type and level of conductivity of the substrate. In manufacturing an integrated circuit (IC), a precise doping profile provides improved IC performance. To achieve a desired doping profile, one or more dopants may be implanted in the form of ions in various doses and various energy levels.

Ion implantation systems may include an ion source and a series of beamline components. The ion source may include a chamber where desired ions are generated. The ion source may also include a power source and an extraction electrode assembly disposed near the chamber. The beamline components may include, for example, a mass analyzer, a first acceleration or deceleration stage, a collimator, and a second acceleration or deceleration stage. Much like a series of optical lenses for manipulating a light beam, the beamline components can filter, focus, and manipulate ions or ion beam having desired species, shape, energy, and other qualities. The ion beam passes through the beamline components and may be directed toward a substrate or wafer mounted on a platen or clamp. The substrate may be moved in one or more dimensions (e.g., translate, rotate, and tilt) by an apparatus, sometimes referred to as a roplat.

The ion implanter generates a stable, well-defined ion beam for a variety of different ion species and extraction voltages. After several hours of operation using source gases (such as $AsH_3$, $PH_3$, $BF_3$, and other species), beam constituents eventually create deposits on the beam optics. Beam optics within a line-of-sight of the wafer also become coated with residues from the wafer, including Si and photoresist compounds. These residues build up on the beamline components, causing spikes in the DC potentials during operation (e.g., in the case of electrically biased components). Eventually the residues flake off, causing an increased likelihood of particulate contamination on the wafer.

One way to prevent the effect of the material accumulation is to intermittently replace beamline components of the ion implanter system. Alternatively, beamline components may be manually cleaned, including powering down the ion source, and releasing the vacuum within the system. After replacing or cleaning the beamline components, the system is then evacuated and powered to reach an operational condition. Accordingly, these maintenance processes may be very time consuming. In addition, the beamline component is not used during the maintenance processes. As such, frequent maintenance processes may decrease throughput, thus increasing overall manufacturing costs.

SUMMARY OF THE DISCLOSURE

In one approach, an ion implantation system may include an electrostatic lens including an entrance for receiving an ion beam and an exit for delivering the ion beam towards a target, the electrostatic lens including a first terminal electrode, a first suppression electrode, and a first ground electrode disposed along a first side of an ion beamline, wherein the first ground electrode is grounded and positioned adjacent the exit. The electrostatic lens may further include a second terminal electrode, a second suppression electrode, and a second ground electrode disposed along a second side of the ion beamline, wherein the second ground electrode is grounded and positioned adjacent the exit, and wherein the second suppression electrode is positioned further downstream along the ion beamline than the first suppression electrode. The implantation system may further include a power supply operable to supply a voltage and a current to the electrostatic lens for controlling the ion beam.

In another approach, a lens may include a chamber having an entrance for receiving an ion beam and an exit for delivering the ion beam towards a target, a first terminal electrode, a first suppression electrode, and a first ground electrode disposed along a first side of an ion beamline, wherein the first ground electrode is grounded and positioned adjacent the exit. The lens may further include a second terminal electrode, a second suppression electrode, and a second ground electrode disposed along a second side of the ion beamline, wherein the second ground electrode is grounded and positioned adjacent the exit.

In another approach, a method may include providing an electrostatic lens including an entrance for receiving an ion beam and an exit for delivering the ion beam towards a target, the electrostatic lens comprising a first terminal electrode, a first suppression electrode, and a first ground electrode disposed along a first side of an ion beamline, wherein the first ground electrode is grounded and positioned adjacent the exit. The electrostatic lens may further include a second terminal electrode, a second suppression electrode, and a second ground electrode disposed along a second side of the ion beamline, wherein the second ground electrode is grounded and positioned adjacent the exit. The method may further include supplying a voltage and a current to the electrostatic lens for controlling the ion beam.

BRIEF DESCRIPTION OF THE DRAWINGS

The accompanying drawings illustrate exemplary approaches of the present disclosure so far devised for the practical application of the principles thereof, and in which:

FIG. 3 is a flow chart of a method for according to embodiments of the present disclosure.

Figure 1:
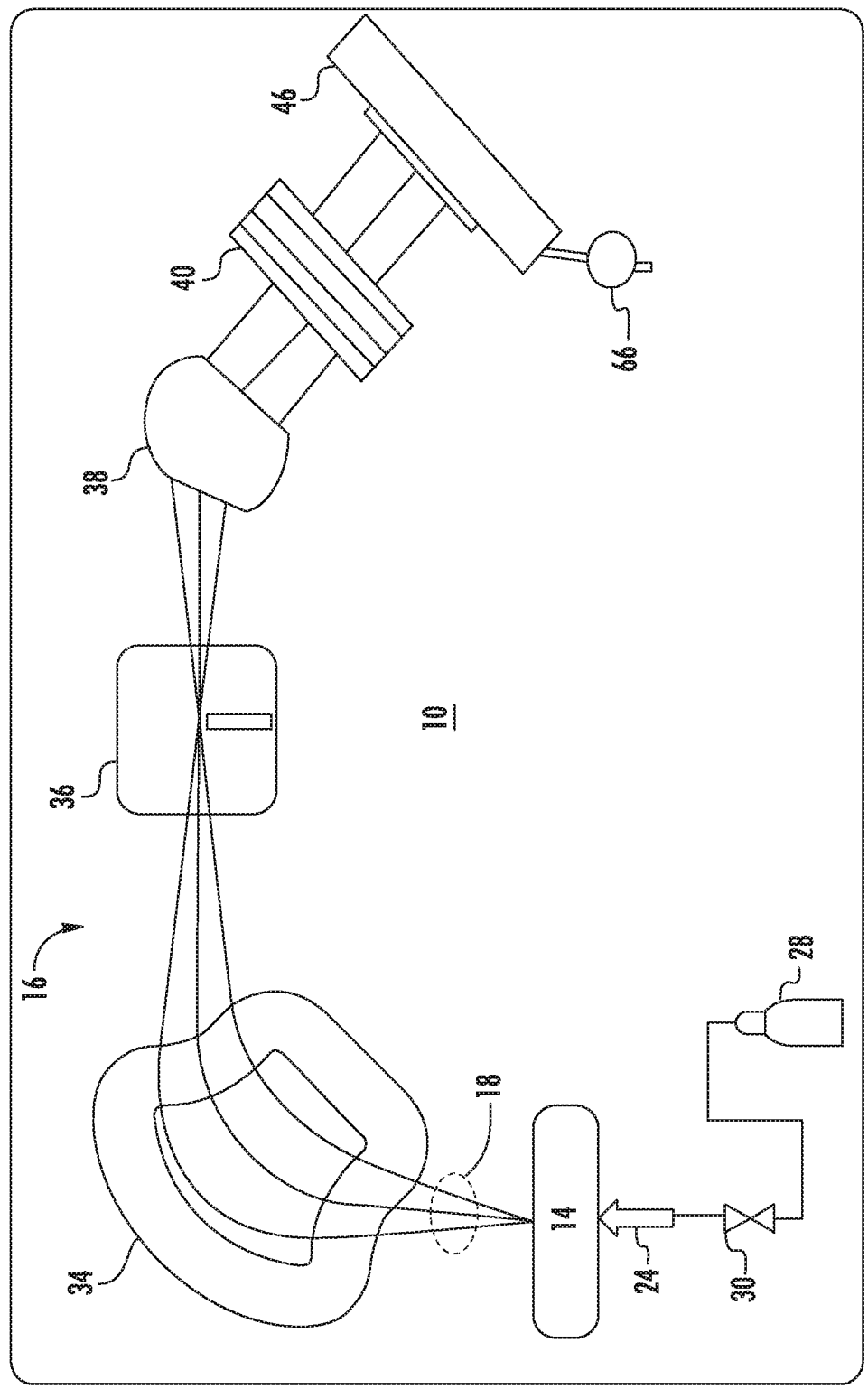
FIG. 1 is a schematic view illustrating an ion implantation system in accordance with embodiments of the present disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

DETAILED DESCRIPTION

An ion implantation system, electrostatic filter or lens, and method in accordance with the present disclosure will now be described more fully hereinafter with reference to the accompanying drawings, where embodiments of the disclosure are shown. The ion implantation system, electrostatic filter, and method may be embodied in many different forms and are not be construed as being limited to the embodiments set forth herein. Instead, these embodiments are provided so this disclosure will be thorough and complete, and will fully convey the scope of the system and method to those skilled in the art.

Provided herein are approaches for reducing particles in an ion implanter. An electrostatic filter may include a housing and a plurality of conductive beam optics (e.g., electrodes) within the housing. The conductive beam optics are arranged around an ion beamline directed towards a wafer, and may include entrance or terminal electrodes proximate an entrance of the housing. The conductive beam optics may further include suppression electrodes downstream along the ion beamline from the terminal electrodes, powered electrodes downstream of the suppression electrodes, and ground electrodes downstream from the powered electrodes. In some embodiments, those electrodes below the ion beam are further away from the ion beamline than those electrodes above the ion beam, thus causing the bottom positioned suppression and powered electrodes to be physically blocked or shielded from being coated by an envelope of back-sputter material returning from the wafer. Furthermore, in some embodiments the bottom positioned suppression electrode may be positioned further downstream along the ion beamline than an upper positioned suppression electrode. The electrostatic filter may further include an electrical system for delivering a voltage and a current to each of the conductive beam optics.

Referring now to FIG. 1, an exemplary system in accordance with the present disclosure is shown. The ion implantation system (hereinafter "system") 10 represents a process chamber containing, among other components, an ion source 14 for producing an ion beam 18, an ion implanter, and a series of beamline components 16. The ion source 14 may comprise a chamber for receiving a flow of gas 24 and generating ions therein. The ion source 14 may also comprise a power source and an extraction electrode assembly disposed near the chamber. The beamline components 16 may include, for example, a mass analyzer 34, a first acceleration or deceleration stage 36, a collimator 38, and an electrostatic lens or electrostatic filter (EF) 40, which may correspond to an acceleration and deceleration stage. Although not shown, the beamline components 16 may further include a plasma flood gun (PFG) downstream of the EF 40.

In exemplary embodiments, the beamline components 16 may filter, focus, and manipulate ions or the ion beam 18 to have a desired species, shape, energy, and other qualities. The ion beam 18 passing through the beamline components 16 may be directed toward a substrate mounted on a platen or clamp within a process chamber 46. As appreciated, the substrate may be moved in one or more dimensions (e.g., translate, rotate, and tilt).

As shown, there may be one or more feed sources 28 operable with the chamber of the ion source 14. In some embodiments, material provided from the feed source 28 may include source material and/or additional material. The source material may contain dopant species introduced into the substrate in the form of ions. Meanwhile, the additional material may include diluent, introduced into the ion source chamber of the ion source 14 along with the source material to dilute the concentration of the source material in the chamber of the ion source 14. The additional material may also include a cleaning agent (e.g., an etchant gas) introduced into the chamber of the ion source 14 and transported within the system 10 to clean one or more of the beamline components 16.

In various embodiments, different species may be used as the source and/or the additional material. Examples of the source and/or additional material may include atomic or molecular species containing boron (B), carbon (C), oxygen (O), germanium (Ge), phosphorus (P), arsenic (As), silicon (Si), helium (He), neon (Ne), argon (Ar), krypton (Kr), nitrogen (N), hydrogen (H), fluorine (F), and chlorine (Cl). Those of ordinary skill in the art will recognize the above listed species are non-limiting, and other atomic or molecular species may also be used. Depending on the application(s), the species may be used as the dopants or the additional material. In particular, one species used as the dopants in one application may be used as the additional material in another application, or vice-versa.

In exemplary embodiments, the source and/or additional material is provided into the ion source chamber of the ion source 14 in gaseous or vapor form. If the source and/or additional material is in non-gaseous or non-vapor form, a vaporizer (not shown) may be provided near the feed source 28 to convert the material into gaseous or vapor form. To control the amount and the rate the source and/or the additional material is provided into the system 10, a flowrate controller 30 may be provided.

The EF 40 may be configured to independently control deflection, acceleration, deceleration, and focus of the ion beam 18. In one embodiment, the EF 40 is a vertical electrostatic energy filter (VEEF). As will be described in greater detail below, the EPM 40 may include an electrode configuration comprising a set of upper electrodes disposed above the ion beam 18 and a set of lower electrodes disposed below the ion beam 18. The set of upper electrodes and the set of lower electrodes may be stationary and have fixed positions. A difference in potentials between the set of upper electrodes and the set of lower electrodes may also be varied along the central ion beam trajectory to reflect an energy of the ion beam 18 at each point along the central ion beam trajectory for independently controlling deflection, acceleration, deceleration, and/or focus of the ion beam 18.

Although non-limiting, the ion source 14 may include a power generator, plasma exciter, plasma chamber, and the plasma itself. The plasma source may be an inductively-coupled plasma (ICP) source, toroidal coupled plasma source (TCP), capacitively coupled plasma (CCP) source, helicon source, electron cyclotron resonance (ECR) source, indirectly heated cathode (IHC) source, glow discharge source, electron beam generated ion source, or other plasma sources known to those skilled in the art.

The ion source 14 may generate the ion beam 18 for processing a substrate. In various embodiments, the ion beam (in cross-section) may have a targeted shape, such as a spot beam or ribbon beam, as known in the art. In order to process the substrate, the ion beam 18 may be accelerated or decelerated to acquire a target energy by establishing a voltage (potential) difference between the ion source 14 and the wafer.

Figure 2:
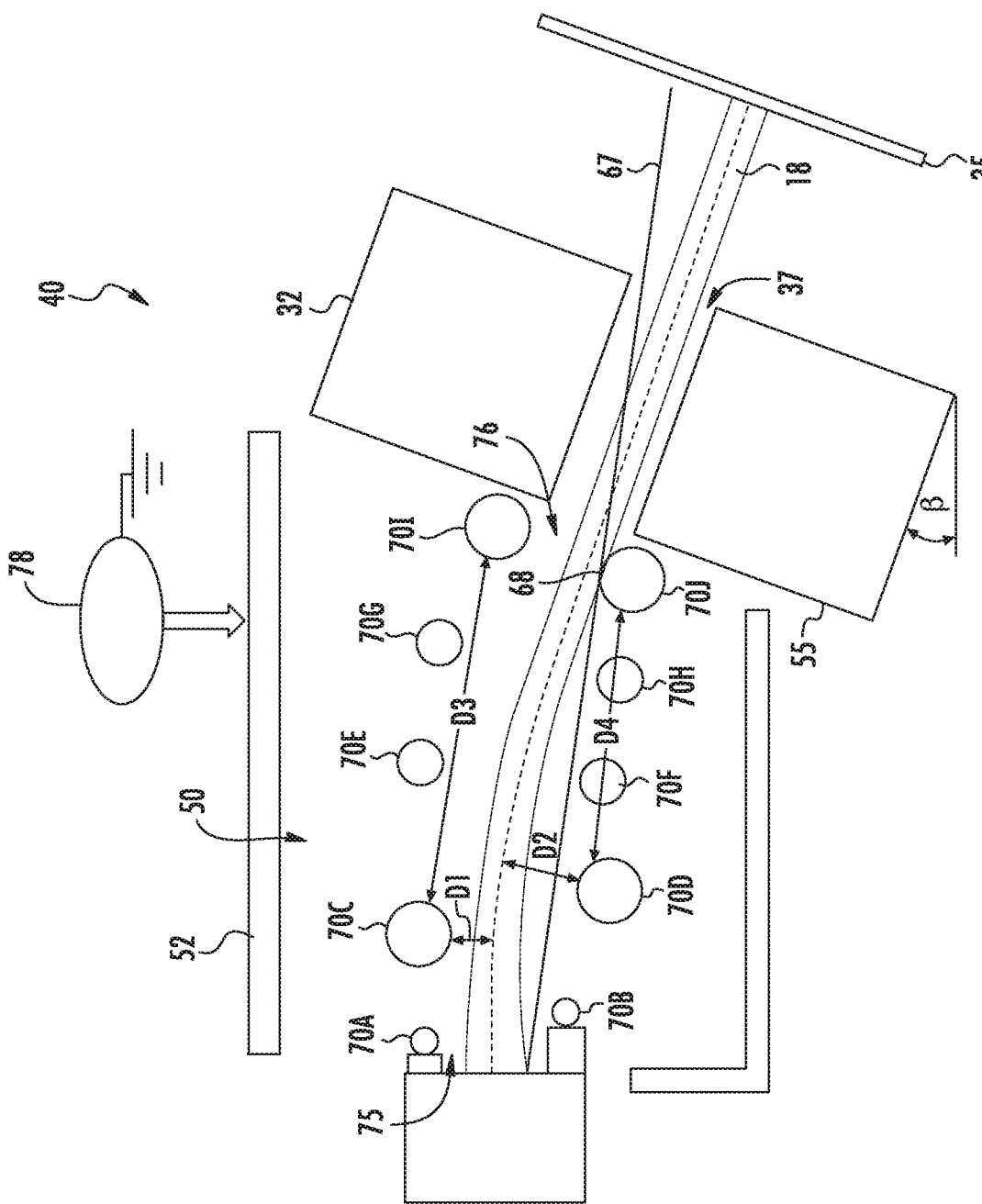
FIG. 2 a side cross-sectional view of an electrostatic filter of the ion implantation system shown in FIG. 1 in accordance with embodiments of the present disclosure.

Referring now to FIG. 2, the EF 40 according to exemplary embodiments will be described in greater detail. As shown, the EF 40 includes an EF chamber 50 defined by a chamber housing 52. The EF 40 may further operate with one or more vacuum pumps (not shown) to adjust a pressure of the EF chamber 50. The EF 40 may be bordered along one end by a PFG 32, which has an opening 37 to permit the ion beam 18 to pass therethrough to the wafer 35. As shown, the PFG 32 is between the EF 40 and the wafer 35, and the PFG 32 and the wafer 35 are oriented at an angle β relative to an ion beamline/trajectory 72. Although non-limiting, the angle β may be between 5-30°. Due to the arrangement of a plurality of conductive beam optics 70A-70J within the EF chamber 50, and due to the orientation of the EF 40 relative to the PFG 32 and the wafer 35, the EF 40 is considered "curved" or asymmetrical.

As shown, the EF 40 may include one or more conductive beam optics 70A-70J, which may be a plurality of graphite electrode rods disposed along the ion beamline/trajectory 72. In this embodiment, the conductive beam optics 70A-70J are arranged in an asymmetrical configuration with respect to the ion beamline/trajectory 72. Although non-limiting, the plurality of conductive beam optics 70A-70J may include a set of entrance or terminal electrodes 70A, 70B proximate an entrance 75 of the EF 40 and a set of exit or ground electrodes 70I, 70J proximate an exit 76 of the EF 40. In some embodiments, the terminal electrodes 70A, 70B are maintained at a terminal voltage, while the ground electrodes 70I, 70J are grounded.

As further shown, the EF 40 may include a set of suppression electrodes 70C, 70D disposed along opposite sides of the ion beamline 72, downstream of the terminal electrodes 70A and 70B, and a plurality of powered electrodes 70E-70H between the suppression electrodes 70C, 70D and the ground electrodes 70I, 70J. In some embodiments, a voltage of the suppression electrodes 70C, 70D is less than or equal to the terminal voltage of the terminal electrodes 70A-70B. Although non-limiting, in the case the ion beam 18 is a decelerating ion beam, powered electrodes 70E and 70G may be more positive than suppression electrode 70C, while powered electrodes 70F and 70H may similarly be more positive compared to suppression electrode 70D. In the case the ion beam 18 is an accelerating ion beam, powered electrodes 70E and 70G may be more negative than suppression electrode 70C, and powered electrodes 70F and 70H may be more negative than suppression electrode 70D.

As shown, each set of electrode pairs provides a space/opening to allow the ion beam 18 (e.g., a ribbon beam) to pass therethrough. Although non-limiting, a first distance 'D1' between suppression electrode 70C and the ion beamline 72 may be less than a second distance 'D2' between suppression electrode 70D and the ion beamline 72. Furthermore, in some embodiments, suppression electrode 70D may be positioned further downstream along the ion beamline than suppression electrode 70C. Said differently, a distance 'D3' between suppression electrode 70C and ground electrode 70I is greater than a distance 'D4' between suppression electrode 70D and ground electrode 70J.

In exemplary embodiments, the conductive beam optics 70A-70J include pairs of conductive pieces electrically coupled to one another. Alternatively, the conductive beam optics 70A-70J may be a series of unitary structures each including an aperture for the ion beam to pass therethrough. In the embodiment shown, upper and lower portions of each electrode pair may have different potentials (e.g., in separate conductive pieces) in order to deflect the ion beam passing therethrough. Although the conductive beam optics 70A-70J are depicted as five (5) electrode pairs, a different number of elements (or electrodes) may be utilized. For example, the configuration of conductive beam optics 70A-70J may utilize a range of three (3) to ten (10) electrode sets.

In some embodiments, the ion beam 18 passing through the electrodes along the ion beamline 72 may include boron or other elements. Electrostatic focusing of the ion beam may be achieved by using several thin electrodes (e.g., the suppression/focusing electrodes 70C, 70D) to control grading of potential along the ion beamline 72. In the configuration of conductive beam optics 70A-70J shown, the ion beam 18 may be be decelerated and deflected by powered electrodes 70E-70G.

In some embodiments, a power supply 78 (e.g., a DC power supply) supplies a voltage and a current to the EF 40. The voltage/current may be supplied to conductive beam optics 70A-70J to generate a plasma within the EF chamber 50. In various embodiments, the voltage and current provided by the power supply 78 may be constant or varied. In one embodiment, the conductive beam optics 70A-70J are held at a series of DC potentials from 0.1 keV-100 keV. The conductive beam optics 70A-70J may be electrically driven in parallel (e.g., individually) or in series to enable uniform and/or independent operation of each of the conductive beam optics 70A-70J.

In some embodiments, as further demonstrated, terminal electrode 70B, suppression electrode 70D, and powered electrodes 70F, 70H can be shielded below a line of sight 67 by the ground electrode 70J from deposition of sputter material from the wafer 35, keeping these electrodes below the line of sight 67 cleaner. As shown, the line of sight 67 may be defined by an internal surface 68 of the ground electrode 70J. Such configuration will eliminate or at least reduced the source of particles, which could be potentially generated at the bottom positioned electrodes 70B, 70D, 70F, 70H, and may eliminate or at least reduce transport mechanisms for material flaked for the top positioned electrodes 70A, 70C, 70E, 70G.

Turning now to FIG. 3, a method 100 according to embodiments of the present disclosure will be described. At block 101, the method 100 may include providing an electrostatic lens including an entrance for receiving an ion beam and an exit for delivering the ion beam towards a target. The electrostatic lens may include a first terminal electrode, a first suppression electrode, and a first ground electrode disposed along a first side of an ion beamline, wherein the first ground electrode is grounded and positioned adjacent the exit. The electrostatic lens may further include a second terminal electrode, a second suppression electrode, and a second ground electrode disposed along a second side of the ion beamline, wherein the second ground electrode is grounded and positioned adjacent the exit.

In some embodiments, the first terminal electrode and the second terminal electrode may be maintained at a terminal voltage. In some embodiments, a voltage of the first and second suppression electrodes may be maintained at a level less than or equal to the terminal voltage. In some embodiments, the first suppression electrode may be positioned at a first distance from the first ground electrode and the second suppression may be positioned at a second distance from and the second ground electrode, wherein the second distance is less than the first distance.

At block 103, the method 100 may include supplying a voltage and a current to the electrostatic lens for controlling the ion beam. In some embodiments, the voltage and the current may be provided to a first set of powered electrodes along the first side of the ion beamline and to a second set of powered electrodes along the second side of the ion beamline, wherein the first set of powered electrodes and the second set of powered electrodes are operable to decelerate and deflect the ion beam through the electrostatic lens and towards a wafer.

For the sake of convenience and clarity, terms such as "top," "bottom," "upper," "lower," "vertical," "horizontal," "lateral," and "longitudinal" will be used herein to describe the relative placement and orientation of these components and their constituent parts, with respect to the geometry and orientation of a component of a semiconductor manufacturing device as appearing in the figures. The terminology will include the words specifically mentioned, derivatives thereof, and words of similar import.

As used herein, an element or operation recited in the singular and proceeded with the word "a" or "an" are understood as potentially including plural elements or operations as well. Furthermore, references to "one embodiment" of the present disclosure are not intended to be interpreted as precluding the existence of additional embodiments also incorporating the recited features.

In accordance with embodiments of the disclosure, the terms "more positive" or "less positive," "greater" or "less," as used herein with respect to voltages (potentials) may refer to a relative voltage of two different entities. Accordingly, 0V is "greater" or "more positive" than −5 kV, while +10 kV is "greater" or more positive than 0V, for example. Moreover, −10 kV is "less positive" than −5 kV. The terms "less negative" negative or "more negative" may also refer to a relative voltage. For example, 0 kV may be referred to as more negative than +5 kV, while +10 kV is less negative than +5 kV.

In view of the foregoing, the present embodiments advantageously eliminate indirect substrate contamination resulting from accumulation of resputtered material from the substrate on electrodes of the electrostatic filter, resulting in an additional contamination source due to subsequent sputtering or flaking from the electrodes.

While certain embodiments of the disclosure have been described herein, the disclosure is not limited thereto, as the disclosure is as broad in scope as the art will allow and the specification may be read likewise. Therefore, the above description are not to be construed as limiting. Those skilled in the art will envision other modifications within the scope and spirit of the claims appended hereto.

What is claimed is:

1. An ion implantation system, comprising:
   an electrostatic lens including an entrance for receiving an ion beam and an exit for delivering the ion beam towards a target, the electrostatic lens comprising:
   a first terminal electrode, a first suppression electrode, and a first ground electrode disposed along a first side of an ion beamline, wherein the first ground electrode is grounded and positioned adjacent the exit; and
   a second terminal electrode, a second suppression electrode, and a second ground electrode disposed along a second side of the ion beamline, wherein the second ground electrode is grounded and positioned adjacent the exit, and wherein the second suppression electrode is positioned further downstream along the ion beamline than the first suppression electrode; and
   a power supply operable to supply a voltage and a current to the electrostatic lens for controlling the ion beam.

2. The ion implantation system of claim 1, further comprising a first set of powered electrodes along the first side of the ion beamline and a second set of powered electrodes along the second side of the ion beamline, wherein the first set of powered electrodes and the second set of powered electrodes are operable to decelerate and deflect the ion beam.

3. The ion implantation system of claim 1, wherein a first distance between the first suppression electrode and the ion beamline is less than a second distance between the second suppression electrode and the ion beamline, and wherein the second suppression electrode is positioned below a line of sight extending between the entrance and the target to shield the second suppression electrode from sputter material from the target.

4. The ion implantation system of claim 1, wherein the first terminal electrode and the second terminal electrode are maintained at a terminal voltage.

5. The ion implantation system of claim 4, wherein a voltage of the first and second suppression electrodes is less than or equal to the terminal voltage.

6. The ion implantation system of claim 1, further comprising a plasma flood gun positioned between the electrostatic lens and a wafer, wherein the plasma flood gun and the wafer are oriented at an angle relative to the electrostatic lens.

7. The ion implantation system of claim 1, wherein a first distance between the first suppression electrode and the first ground electrode is greater than a second distance between the second suppression electrode and the second ground electrode.

8. A lens, comprising:
   a chamber having an entrance for receiving an ion beam and an exit for delivering the ion beam towards a target;
   a first terminal electrode, a first suppression electrode, and a first ground electrode disposed along a first side of an ion beamline, wherein the first ground electrode is grounded and positioned directly adjacent the exit; and
   a second terminal electrode, a second suppression electrode, and a second ground electrode disposed along a second side of the ion beamline, wherein the second ground electrode is grounded and positioned directly adjacent the exit, and wherein the second suppression electrode is positioned further downstream along the ion beamline than the first suppression electrode.

9. The lens of claim 8, wherein a first distance between the first suppression electrode and the ion beamline is less than a second distance between the second suppression electrode and the ion beamline, wherein the second terminal electrode, the second ground electrode, and the second suppression electrode are positioned below a line of sight extending between the entrance and the target, wherein the line of sight is defined by an internal surface of the second ground electrode, and wherein the second ground electrode shields the second terminal electrode and the second suppression electrode from sputter material from the target.

10. The lens of claim 9, further comprising a first set of powered electrodes along the first side of the ion beamline and a second set of powered electrodes along the second side of the ion beamline, wherein the second set of powered electrodes is positioned below the line of sight.

11. The lens of claim 10, wherein the first set of powered electrodes and the second set of powered electrodes are operable to decelerate and deflect the ion beam.

12. The lens of claim 8, wherein the first terminal electrode and the second terminal electrode are maintained at a terminal voltage.

13. The lens of claim 12, wherein a voltage of the first and second suppression electrodes is less than or equal to the terminal voltage.

14. The lens of claim 8, wherein a first distance between the first suppression electrode and the first ground electrode is greater than a second distance between the second suppression electrode and the second ground electrode.

15. A method, comprising:
providing an electrostatic lens including an entrance for receiving an ion beam and an exit for delivering the ion beam towards a target, the electrostatic lens comprising:
- a first terminal electrode, a first suppression electrode, and a first ground electrode disposed along a first side of an ion beamline, wherein the first ground electrode is grounded and positioned adjacent the exit; and
- a second terminal electrode, a second suppression electrode, and a second ground electrode disposed along a second side of the ion beamline, wherein the second ground electrode is grounded and positioned adjacent the exit, and wherein the second suppression electrode is positioned further downstream along the ion beamline than the first suppression electrode; and supplying a voltage and a current to the electrostatic lens for controlling the ion beam.

16. The method of claim 15, further comprising providing the voltage and the current to a first set of powered electrodes along the first side of the ion beamline and to a second set of powered electrodes along the second side of the ion beamline, wherein the first set of powered electrodes and the second set of powered electrodes are operable to decelerate and deflect the ion beam.

17. The method of claim 15, further comprising maintaining the first terminal electrode and the second terminal electrode at a terminal voltage.

18. The method of claim 17, further comprising maintaining a voltage of the first and second suppression electrodes at a level less than or equal to the terminal voltage.

19. The method of claim 15, further comprising:
- positioning the first suppression electrode at a first distance from the first ground electrode; and
- positioning the second suppression at a second distance from and the second ground electrode, wherein the second distance is less than the first distance.

* * * * *